(12) United States Patent
Bai

(10) Patent No.: US 8,285,149 B2
(45) Date of Patent: Oct. 9, 2012

(54) METHOD AND SYSTEM FOR INTEGRATED DWDM TRANSMITTERS

(75) Inventor: Yu Sheng Bai, Los Altos Hills, CA (US)

(73) Assignee: Futurewei Technologies, Inc., Plano, TX (US)

(*) Notice: Subject to any disclaimer, the term of this patent is extended or adjusted under 35 U.S.C. 154(b) by 728 days.

(21) Appl. No.: 11/696,472

(22) Filed: Apr. 4, 2007

(65) Prior Publication Data

US 2008/0080864 A1    Apr. 3, 2008

Related U.S. Application Data

(60) Provisional application No. 60/827,825, filed on Oct. 2, 2006.

(51) Int. Cl.
    *H04B 10/04* (2006.01)
(52) U.S. Cl. .............. 398/200; 398/142; 398/164
(58) Field of Classification Search .............. 398/79, 398/183, 200, 201, 142, 164
    See application file for complete search history.

(56) References Cited

U.S. PATENT DOCUMENTS

| | | | |
|---|---|---|---|
| 3,204,418 A | 9/1965 | Mathews | |
| 5,061,032 A | 10/1991 | Meltz et al. | |
| 5,206,920 A | 4/1993 | Cremer et al. | |
| 5,349,821 A | 9/1994 | Schrage | |
| 5,488,678 A | 1/1996 | Taneya et al. | |
| 5,617,234 A | 4/1997 | Koga et al. | |
| 6,027,254 A | 2/2000 | Yamada et al. | |
| 6,064,783 A | 5/2000 | Congdon et al. | |
| 6,108,472 A | 8/2000 | Rickman et al. | |
| 6,122,934 A | 9/2000 | Narita et al. | |
| 6,192,170 B1 | 2/2001 | Komatsu | |
| 6,219,470 B1 | 4/2001 | Tu | |
| 6,356,692 B1 | 3/2002 | Ido et al. | |
| 6,377,725 B1 | 4/2002 | Stevens et al. | |
| 6,393,185 B1 | 5/2002 | Deacon | |
| 6,445,477 B1 | 9/2002 | Madsen et al. | |
| 6,486,440 B1 | 11/2002 | Crafts et al. | |

(Continued)

FOREIGN PATENT DOCUMENTS

CN    1252654 A    5/2000

(Continued)

OTHER PUBLICATIONS

Hashimoto, Toshikazu et al., "Hybrid Integration of Spot-Size Converted Laser Diode on Planar Lightwave Circuit Platform by Passive Alignment Technique," IEEE Photonics Technology Letters, vol. 8, No. 11, pp. 1504-1506, Nov. 1996.

(Continued)

*Primary Examiner* — Dzung Tran

(57) ABSTRACT

An integrated DWDM transmitter apparatus includes a support component and a silica-on-silicon substrate overlying the support component. The support component includes a temperature adjustment component. The silica-on-silicon substrate overlies the support component and includes a silica layer and a silicon layer. The silica-on-silicon substrate includes a corresponding a substrate surface which includes a first surface region and a second surface region. In an embodiment, the two surface regions are not coplanar. The transmitter apparatus includes an optical multiplexer within the silica layer, the optical multiplexer including a plurality of input waveguides and at least an output waveguide. The transmitter apparatus also includes one or more semiconductor laser array chips overlying the first surface region of the silica-on-silicon substrate. Each of the laser array chips including two or more lasers, which are optically coupled to corresponding ones of the plurality of input waveguides.

22 Claims, 6 Drawing Sheets

U.S. PATENT DOCUMENTS

| | | | |
|---|---|---|---|
| 6,539,725 B2 | 4/2003 | Bell | |
| 6,556,752 B2 | 4/2003 | Fang et al. | |
| 6,567,198 B1 | 5/2003 | Kang | |
| 6,628,850 B1 | 9/2003 | Yao | |
| 6,757,499 B1 | 6/2004 | Aoki | |
| 6,865,304 B1 | 3/2005 | Ticknor | |
| 6,865,320 B1 | 3/2005 | Westbrook | |
| 6,873,763 B2 | 3/2005 | Nikonov | |
| 6,952,504 B2 | 10/2005 | Bi et al. | |
| 7,050,666 B2 | 5/2006 | Welch et al. | |
| 7,058,245 B2 | 6/2006 | Farahi | |
| 7,062,114 B2 | 6/2006 | Webjorn et al. | |
| 7,203,401 B2 | 4/2007 | Mossberg et al. | |
| 7,245,379 B2 | 7/2007 | Schwabe | |
| 7,447,393 B2 | 11/2008 | Yan et al. | |
| 7,460,742 B2 | 12/2008 | Joyner | |
| 7,483,599 B2 | 1/2009 | Kish, Jr. et al. | |
| 2001/0041025 A1 | 11/2001 | Farahi | |
| 2001/0052234 A1 | 12/2001 | Venkatasubramanian | |
| 2003/0006224 A1 | 1/2003 | Crafts et al. | |
| 2003/0016415 A1 | 1/2003 | Jun et al. | |
| 2003/0039015 A1 | 2/2003 | Vujkovic-Cvijin et al. | |
| 2003/0095737 A1* | 5/2003 | Welch et al. | 385/14 |
| 2004/0005133 A1 | 1/2004 | Johannessen | |
| 2004/0067006 A1 | 4/2004 | Welch et al. | |
| 2004/0081410 A1 | 4/2004 | Aronson et al. | |
| 2004/0131302 A1 | 7/2004 | Kouta et al. | |
| 2004/0208444 A1 | 10/2004 | Grunnet-Jepsen et al. | |
| 2005/0018951 A1* | 1/2005 | Mossberg et al. | 385/14 |
| 2005/0068536 A1 | 3/2005 | Schwabe | |
| 2005/0094926 A1 | 5/2005 | Dominic et al. | |
| 2005/0100290 A1 | 5/2005 | Huang | |
| 2005/0100345 A1* | 5/2005 | Welch et al. | 398/183 |
| 2005/0163171 A1 | 7/2005 | Ng et al. | |
| 2005/0210883 A1 | 9/2005 | Bell | |
| 2006/0002443 A1 | 1/2006 | Farber et al. | |
| 2006/0141649 A1* | 6/2006 | Joyner et al. | 438/31 |
| 2006/0193553 A1 | 8/2006 | Mossberg et al. | |
| 2006/0279734 A1 | 12/2006 | Yan et al. | |
| 2007/0268489 A1 | 11/2007 | Schwabe | |
| 2008/0070610 A1 | 3/2008 | Nishio | |
| 2009/0087138 A1 | 4/2009 | Yan et al. | |

FOREIGN PATENT DOCUMENTS

| | | |
|---|---|---|
| CN | 1287542 A | 3/2001 |
| CN | 1303195 A | 7/2001 |
| CN | 1423140 A | 6/2003 |
| CN | 1453599 A | 11/2003 |
| CN | 1553239 A | 12/2004 |
| CN | 1639614 A | 7/2005 |
| EP | 0 495 413 A1 | 7/1992 |
| EP | 0 497 358 A1 | 8/1992 |
| EP | 0 573 724 A1 | 12/1993 |
| EP | 1 028 503 A2 | 8/2000 |
| EP | 1 028 503 A3 | 8/2000 |
| EP | 1 218 781 | 3/2001 |
| EP | 1 133 082 A1 | 9/2001 |
| EP | 1 436 931 B1 | 12/2005 |
| JP | 05323246 A | 12/1993 |
| JP | 06-0899455 | 3/1994 |
| JP | 09-83056 A | 3/1997 |
| JP | 10048449 A | 2/1998 |
| JP | 10233548 A | 9/1998 |
| JP | 11125727 A | 5/1999 |
| JP | 11202159 A | 7/1999 |
| JP | 11211924 A | 8/1999 |
| JP | 2000121870 A | 4/2000 |
| JP | 2000162455 | 6/2000 |
| JP | 2000174397 A | 6/2000 |
| JP | 2000236135 A | 8/2000 |
| JP | 2000249853 A | 9/2000 |
| JP | 2000294809 A | 10/2000 |
| JP | 2001051136 A | 2/2001 |
| JP | 2001051142 A | 2/2001 |
| JP | 2001111156 A | 4/2001 |
| JP | 2001-147336 | 5/2001 |
| JP | 2001127377 A | 5/2001 |
| JP | 2001228021 A | 8/2001 |
| JP | 2001244571 A | 9/2001 |
| JP | 2002006158 A | 1/2002 |
| JP | 2002055249 A | 2/2002 |
| JP | 2002258080 A | 9/2002 |
| JP | 2003014994 A | 1/2003 |
| JP | 2003508814 T | 3/2003 |
| JP | 2003513328 T | 4/2003 |
| JP | 2004086185 A | 3/2004 |
| JP | 2005010373 | 1/2005 |
| JP | 2005215942 A | 8/2005 |
| JP | 2005531818 A | 10/2005 |
| JP | 2006230236 A | 9/2006 |
| JP | 2009197457 A | 9/2009 |
| WO | WO 01/33268 A1 | 5/2001 |
| WO | WO 2005/013446 A1 | 2/2005 |
| WO | WO 2006/019362 A1 | 2/2006 |
| WO | WO 2008/043288 A1 | 4/2008 |
| WO | WO 2008/043318 A1 | 4/2008 |
| WO | WO 2008/049372 A1 | 5/2008 |
| WO | WO 2008/122221 A1 | 10/2008 |

OTHER PUBLICATIONS

Henry, C. H. et al., "Glass Waveguides on Silicon for Hybrid Optical Packaging," Journal of Lightwave Technology, vol. 7, No. 10, pp. 1530-1539, Oct. 1989.

Ketelsen, L. J. P. et al., "Multiwavelength DFB Laser Array With Integrated Spot Size Converters," IEEE Journal of Quantum Electronics, vol. 36, No. 6, pp. 641-646, Jun. 2000.

Koch, T. L. et al., "Tapered Waveguide InGaAs/InGaAsP Multiple-Quantum-Well Lasers," IEEE Photonics Technology Letters, vol. 2, No. 2, pp. 88-90, Feb. 1990.

Lealman, I. F. et al., "1.56μm InGaAsP/InP Tapered Active Layer Multiquantum Well Laser With Improved Coupling to Cleaved Singlemode Fibre," Electronics Letters, vol. 30, No. 11, pp. 857-859, May 26, 1994.

Ogawa, Ikuo et al., "Reduction of Waveguide Facet Reflection in Optical Hybrid Integrated Circuit Using Saw-Toothed Angled Facet," IEEE Photonics Technology Letters, vol. 7, No. 1, pp. 44-46, Jan. 1995.

Tohmori, Y. et al., "Spot-Size Converted 1.3μm Laser With Butt-Jointed Selectively Grown Vertically Tapered Waveguide," Electronics Letters, vol. 31, No. 13, pp. 1069-1070, Jun. 22, 1995.

Hashimoto, Toshikazu et al., "Multichip Optical Hybrid Integration Technique With Planar Lightwave Circuit Platform," Journal of Lightwave Technology, vol. 16, No. 7, pp. 1249-1258, Jul. 1998.

Kaneko, Akimasa et al., "Design and Applications of Silica-Based Planar Lightwave Circuits," IEEE Journal of Selected Topics in Quantum Electronics, vol. 5, No. 5, pp. 1227-1236, Sep./Oct. 1999.

Tervonen, A. et al., "Control of Wavelength Alignment in Wavelength Division Multiple Access Passive Optical Network," Electronics Letters, vol. 39, No. 2, 2 pages, Jan. 23, 2003.

Notice of Reasons for Rejection dated Mar. 22, 2011 in connection with Japanese Patent Application No. 2008-548920.

Written Opinion of the International Searching Authority dated Dec. 20, 2007 in connection with International Patent Application No. PCT/CN2007/070671.

Translation of Office Action dated Sep. 26, 2010 in connection with Chinese Patent Application No. 200780029963.2.

Translation of Office Action dated Feb. 9, 2011 in connection with Chinese Patent Application No. 200780029963.2.

Kwong et al., "Novel Single Mode Laser Fabrication Using Focus Ion Beam (FIB) Etching," Optical Fiber Communication Conference, 2006 and the 2006 National Fiber Optic Engineers Conference 2006, Mar. 5-10, 2006 3 pages.

Li, et al. "Hybrid Integration", Optical Fiber Telecommunications IIIB, Lucent Technologies 1997, p. 367-368.

Yoshikuni, Yuzo, "Semiconductor Arrayed Waveguide Gratings for Photonic Integrated Devices," IEEE Journal of Selected Topics in Quantum Electronics, vol. 8, No. 6, Nov./Dec. 2002.

Zirngibl, et al., "WDM receiver by monolithic integration of an optical preamplifier, waveguide grating router and photodiode array," Electronics Letters, vol. 31, No. 7, p. 581, (Mar. 30, 1995).

S.Y. Huang et al., "Performance and Reliability of Redundant Thermoelectric Coolers", Electronic Components and Technology Conference, May 11-16, 1991, p. 34-37.

T. Ohyama et al., "4-Channel x 10-Gbit/s Hybrid Integrated Multiwavelength Laser Module Using Silica-Based Planar Lightwave Circuit Platform with 1.5%.-Δ", 28th European Conference on Optical Communication, 2002, vol. 2, Integration and Modules 5.4.1, 2 pages.

Marko Lackovic, et al., "Sensitivity Analysis of Component Failures in the Switched WDM Network", In Proceedings of Optical Networking Design and Modeling (ONDM) (Ghent, Belgium, Feb. 2-4, 2004), p. 205-224.

Radhakrishnan Nagarajan, et al., "Large-Scale Photonic Integrated Circuits", IEEE Journal of Selected Topics in Quantum Electronics, vol. 11, No. 1, Jan./ Feb. 2005, p. 50-65.

International Search Report end Written Opinion of PCT Application No. PCT/CN2007/071128, date of mailing Mar. 20, 2008.

K.S. Feder, et al., "In-Fiber Spectrometer Using Tilted Fiber Gratings", IEEE Photonics Technology Letters, vol. 15, No. 7, Jul. 2003, p. 933-935.

P.S. Westbrook, et al., "In-Line Polarimeter Using Blazed Fiber Gratings", IEEE Photonics Technology Letters, vol. 12, No. 10, Oct. 2000, p. 1352-1354.

International Search Report and Written Opinion of PCT Application No. PCT/CN2007/070806, date of mailing Dec. 6, 2007.

Communication pursuant to Article 94(3) EPC dated Apr. 30, 2010 in connection with European Patent Application No. 07 816 997.6.

Partial Translation of Office Action dated Jun. 2, 2010 in connection with Chinese Patent Application No. 200780029963.2.

Xingsheng Liu, et al., "Comparison Between Epi-Down and Epi-Up Bonded High-Power Single-Mode 980-nm Semiconductor Lasers", IEEE Transactions on Advanced Packaging, vol. 27, No. 4, Nov. 2004, p. 640-646.

Marko Labudovic, et al., "Heat Transfer and Residual Stress Modeling of a Diamond Film Heat Sink for High Power Laser Diodes", IEEE Transactions on Components and Packaging Technologies, vol. 26, No. 3, Sep. 2003, p. 575-581.

Communication pursuant to Article 94(3) EPC dated May 27, 2009 in connection with European Patent Application No. 07 817 120.4.

Supplementary European Search Report dated Jan. 14, 2009 in connection with European Patent Application No. 07 817 120.4.

Translation of Office Action dated Nov. 12, 2010 in connection with Chinese Patent Application No. 200780018559.5.

Decision to refuse a European Patent Application dated Mar. 29, 2010 in connection with European Patent Application No. 07 817 120.4.

Summons to attend oral proceedings pursuant to Rule 115(1) EPC dated Oct. 13, 2009 in connection with European Patent Application No. 07 817 120.4.

Karsten Drogemuller, "Cost Effective Multi Optical Channel DWDM Transmitter Modules for the Metro Market", 2001 IEEE, p. 109-110.

Communication pursuant to Article 94(3) EPC dated May 27, 2009 in connection with European Patent Application No. 07 801 079.0.

Supplementary European Search Report dated Nov. 5, 2009 in connection with European Patent Application No. 08 71 5157.

Notification of Transmittal of the International Search Report and the Written Opinion of the International Searching Authority, or the Declaration dated May 15, 2008 in connection with International Patent Application No. PCT/CN2008/070421.

Su Hwan Oh, et al., "Fabrication of WDM-PON OLT Source using External Cavity Laser", The 5th International Conference on Optical Internet (COIN 2006), Jul. 9-13, 2006, p. 217-219.

Notice of Reasons for Rejection dated Aug. 2, 2011 in connection with Japanese Patent Application No. 2008-548920.

Summons to attend oral proceedings pursuant to Rule 115(1) EPC dated Sep. 22, 2011 in connection with European Patent Application No. 07 801 079.0.

Notice of Reasons for Rejection dated Mar. 22, 2011 in connection with Japanese Patent Application No. 2008-552667.

Translation of Office Action dated Nov. 21, 2008 in connection with Chinese Patent Application No. 200780018559.5.

Translation of Office Action dated Aug. 10, 2011 in connection with Chinese Patent Application No. 200780018559.5.

Provision of the minutes in accordance with Rule 124(4) EPC dated Mar. 7, 2012 in connection with European Patent Application No. 07 801 079.0.

Second Auxiliary Request dated Dec. 16, 2011 in connection with European Patent Application No. 07 801 079.0.

* cited by examiner

METHOD AND SYSTEM FOR INTEGRATED DWDM TRANSMITTERS

CROSS-REFERENCES TO RELATED APPLICATIONS

This application claims priority to U.S. Provisional Patent Application No. 60/827,825, filed Oct. 2, 2006, commonly assigned, incorporated by reference herein for all purposes.

STATEMENT AS TO RIGHTS TO INVENTIONS MADE UNDER FEDERALLY SPONSORED RESEARCH OR DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK

NOT APPLICABLE

BACKGROUND OF THE INVENTION

The present invention is directed to fiber optical transport systems. More particularly, the invention provides a method and system for reducing the size and cost of optical transmitter systems. Merely by way of example, the invention has been applied to DWDM optical transport systems. But it would be recognized that the invention has a much broader range of applicability.

Since its first deployment in the middle of 1990s, dense wavelength division multiplexing (DWDM) has become a dominant technology for long haul and regional backbone transport networks, and is gradually making its way to metro area networks. In a conventional DWDM system, each optical component, be it a laser or a MUX filter, is individually packaged. A linecard is built around one or several optical components. For example, a transmitter card for a given wavelength includes a laser and a modulator (or an integrated laser/modulator). The laser chips sitting inside the laser packages are typically made of indium phosphide (InP) semiconductor compounds. The optical outputs of multiple transmitter linecards at different wavelengths are combined through a multiplexer linecard, which includes some MUX filters. A commonly used MUX filter is based on array waveguide grating (AWG) made of silica-on-silicon. The optical connections between the linecards are through optical fibers. The optical output from the multiplexer linecard is then amplified by an optical amplifier and launched into the transmission fiber.

Even though these conventional DWDM systems are useful in some areas, they have many limitations that restrict their effectiveness in broader applications. Some of these limitations are discussed below, and then improved techniques based on embodiments of the present invention are presented.

BRIEF SUMMARY OF THE INVENTION

The present invention is directed to fiber optical transport systems. More particularly, the invention provides a method and system for reducing the size and cost of optical transport systems. Merely by way of example, the invention has been applied to DWDM optical transmitter systems. But it would be recognized that the invention has a much broader range of applicability.

In a specific embodiment, the invention provides an integrated DWDM transmitter apparatus, which includes a support component and a silica-on-silicon substrate. The support component includes a temperature adjustment component. In a specific embodiment, the temperature adjustment component includes a thermal electric cooler (TEC). The silica-on-silicon substrate includes a silica layer and a silicon layer. The silica-on-silicon substrate corresponds to a substrate surface, which includes a first surface region and a second surface region. In an embodiment, the first surface region and the second surface region are not coplanar. The integrated DWDM transmitter apparatus also includes an optical multiplexer within the silica layer. The optical multiplexer includes a plurality of input waveguides and at least an output waveguide. In a specific embodiment, the optical multiplexer includes an array waveguide grating (AWG). The apparatus also includes one or more semiconductor laser array chips overlying the first surface region of the silica-on-silicon substrate. In a specific example, each of the one or more semiconductor laser array chips is mounted on the first surface region of the silica-on-silicon substrate using a flip-chip method. In an embodiment, each of the one or more laser array chips includes two or more lasers, and each of the two or more lasers is optically coupled to a corresponding one of the plurality of input waveguides. In an example, each of the one or more semiconductor laser array chips includes two or more InP laser diodes. In a specific embodiment, the optical multiplexer overlies the silicon layer and is located under the second surface region.

According to another embodiment of the invention, a DWDM transmitter system is provided. The DWDM transmitter system includes a support component and a silica-on-silicon substrate overlying the support component. The support component includes a temperature adjustment component. In a specific embodiment, the temperature adjustment component includes a thermal electric cooler (TEC). The silica-on-silicon substrate includes a silica layer and a silicon layer. The silica-on-silicon substrate corresponds to a substrate surface, which includes a first surface region and a second surface region. In an embodiment, the first surface region and the second surface region are not coplanar. The DWDM transmitter system also includes an optical multiplexer within the silica layer under the first surface region of the silica-on-silicon substrate. The optical multiplexer includes a plurality of input waveguides and at least an output waveguide. The DWDM transmitter system also includes one or more semiconductor laser array chips overlying the second surface region of the silica-on-silicon substrate. Each of the one or more laser array chips includes two or more lasers, and each of the two or more lasers is optically coupled to a corresponding one of the plurality of input waveguides. The transmitter system also includes a plurality of micro heaters, each of the plurality of micro heaters being disposed adjacent to one of the lasers. The DWDM transmitter system further includes an optical analyzer and a controller for maintaining a center wavelength of the transmitter system. The optical analyzer is optically coupled to the output waveguide. The controller is electrically coupled to the optical analyzer and the plurality of micro heaters for adjusting a temperature of the temperature adjustment component using information associated with the center wavelength.

In an alternative embodiment, the invention provides a method for maintaining a target wavelength associated with an integrated DWDM transmitter. The method includes providing an integrated DWDM transmitter which includes a plurality of InP laser diodes mounted on a silica-on-silicon substrate. The integrated transmitter also includes a thermal electric cooler (TEC) underlying the silica-on-silicon substrate and a corresponding plurality of micro heaters. Each micro heater is disposed adjacent to each of the plurality of laser diodes. The method includes determining laser wavelength distribution at a predetermined global TEC temperature and adjusting the TEC to a second global temperature to shift the each laser wavelength to below a corresponding target wavelength according to ITU-T grids. The method then fine tunes the wavelength of each of the laser diodes. For each of the plurality of laser diodes, the method adjusts a temperature of a corresponding micro heater to increase the center wavelength to the corresponding target wavelength according to the ITU-T grids.

In yet another embodiment, the invention provides a method for making an integrated DWDM transmitter apparatus. The method includes providing a silicon layer and forming an optical multiplexer within a silica layer located on the silicon layer. In an embodiment, the optical multiplexer includes a plurality of input waveguides and at least an output waveguide. The method includes removing at least a first portion of the silica layer to expose a surface. In a specific embodiment, the exposed surface is a silicon surface. In another embodiment, the exposed surface is a silica surface. The method also includes mounting one or more semiconductor laser array chips to the surface. The mounting can be performed, for example, using a flip-chip mounting method. Each of the one or more laser array chips includes two or more lasers and each of the two or more lasers is optically coupled to a corresponding one of the plurality of input waveguides. In a specific embodiment, each of the one or more laser array chips is made in InP. The method includes attaching the silicon layer to a support component, the support component including a temperature adjustment component. In a specific embodiment, the forming the optical multiplexer includes forming a first un-doped silica sub-layer on the silicon layer, forming a doped silica sub-layer on the first un-doped silica sub-layer, etching at least a second portion of the doped silica sub-layer, and depositing a second un-doped silica sub-layer on the etched doped silica sub-layer and the first un-doped silica sub-layer.

Many benefits are achieved by way of the present invention over conventional techniques. For example, in certain embodiments, the invention provides methods and apparatus that use a silica/silicon AWG as a substrate to mount semiconductor (InP) laser/modulator chips. Because the processing cost per unit area for silica-on-silicon can be two orders of magnitude lower than that for InP, the AWG according to embodiments of the present invention can be made at much lower cost. Silica-on-silicon AWGs is a much more mature technology. For example, transmission loss is much smaller in AWGs made of silica-on-silicon than those made of InP. Moreover according to an embodiment of the invention, without the AWG, the InP chip can be made much smaller. The high yield and the small size significantly reduce the cost of the InP chips used for hybrid integration in accordance to embodiments of the present invention. In term of finished device, the size of a hybrid integrated DWDM transmitter according to specific embodiments of the invention is comparable to that of a monolithically integrated DWDM transmitter. Thus the small size advantage of an integrated DWDM transmitter is retained according to embodiments of the present invention.

Various additional objects, features, and advantages of the present invention can be more fully appreciated with reference to the detailed description and accompanying drawings that follows.

DETAILED DESCRIPTION OF THE INVENTION

Figures 1A, 1B:
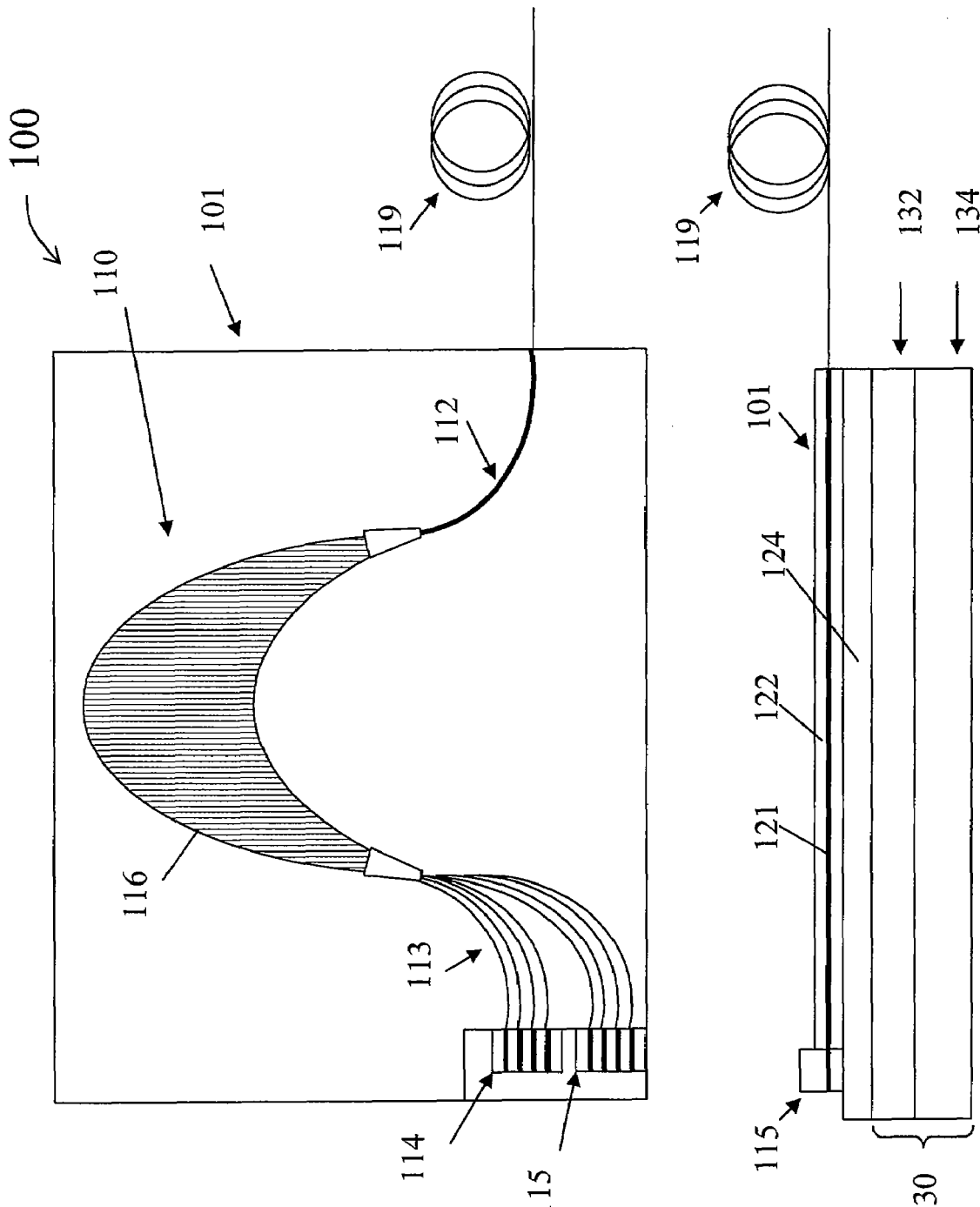
FIG. 1A is a simplified top view diagram of a hybrid integrated DWDM transmitter according to an embodiment of the present invention.
FIG. 1B is a simplified cross-sectional view diagram of the hybrid integrated DWDM transmitter of FIG. 1A according to an embodiment of the invention.

The present invention is directed to fiber optical transport systems. More particularly, the invention provides a method and device for reducing the size and cost of optical transmitter systems. Merely by way of example, the invention has been applied to DWDM optical transport systems. But it would be recognized that the invention has a much broader range of applicability.

As discussed above, the optical components in a conventional DWDM system are usually individually packaged. To a great extent, the packaging cost determines the price of the components. For example, a bare distributed feedback (DFB) laser chip may cost only a few dollars, while a packaged DFB laser sells for several hundred dollars, mostly due to the cost of packaging. It is thus difficult to further reduce the cost with the conventional DWDM system design. In addition, the multiple linecards, each built with the individual components, make it difficult to reduce the size of the DWDM terminals.

In the last several years, there have been efforts to monolithically integrate multiple lasers/modulators and the AWG onto a single InP chip. In this way, the size of a DWDM terminal can be significantly reduced. Monolithic integration methods rely heavily on InP chip processing technologies, which have yet to reach maturity. The yield of InP processing is low compared to silicon processing, even for single element chips. With multiple elements integrated on a single chip, the yield tends to decrease exponentially. In addition, the AWG, which is a passive element, usually occupies much larger area of the integrated chip than the active elements, such as lasers. This results in an inefficient use of the expensive InP materials.

As a general rule of thumb, the size of InP wafers is an order of magnitude smaller than silicon wafers. For example, the diameters of InP wafers are typically 2" or 3", as compared to 8" or even 12" for silicon wafer. The processing cost per unit area for InP wafers can be two orders of magnitude higher than that for silicon wafers. The low chip yield, coupled with high processing cost, makes it uneconomical to monolithically integrate a DWDM transmitter on an InP chip. From the above, it is seen that an improve technique for DWDM transmitter design is desired.

Depending upon the embodiment, the present invention includes various features, which may be used. These features include the following:

1. A silica-on-silicon planar lightwave circuit (PLC) is used as a bench to mount the InP chips, so that the passive waveguides of the PLC are optically coupled to the active InP waveguides, such as semiconductor lasers.
2. A hybrid integrated DWDM transmitter includes one or more multiple direct-modulated laser (DML) array chips made of InP and an arrayed waveguide grating (AWG) made of silica-on-silicon planar lightwave circuit (PLC); and
3. A method is provided for maintaining the center wavelengths of integrated DWDM transmitter using an optical analyzer and a thermal electric cooler (TEC) coupled to the integrated transmitter.

As shown, the above features may be in one or more of the embodiments. These features are merely examples, which should not unduly limit the scope of the application. One of ordinary skill in the art would recognize many variations, modifications, and alternatives.

FIG. 1A is a simplified top view diagram of a hybrid integrated DWDM transmitter according to an embodiment of the present invention. This diagram is merely an example, which should not unduly limit the scope of the claims herein. One of ordinary skill in the art would recognize other variations, modifications, and alternatives. As shown, hybrid integrated DWDM transmitter 100 includes a silicon bench 101. In a specific embodiment, the silicon bench 101 includes a silica-on-silicon substrate. Hybrid transmitter 100 also includes an optical multiplexer in the silicon bench. In a specific embodiment, the optical multiplexer includes an arrayed waveguide grating (AWG) 110 made in a silica-on-silicon planar lightwave circuit (PLC) in the silicon bench. Hybrid transmitter 100 further includes one or more multiple laser array chips, e.g., 114 and 115. In a preferred embodiment, the laser array chips include DML lasers made in InP. In a specific embodiment, each InP laser array chip includes two or more lasers. Of course, there can be other variations, modifications, and alternatives.

In a specific embodiment, the AWG 110 includes one optical output port 112, multiple input ports 113, and grating waveguides 116. In an embodiment, the output port 112 is optically coupled to an optical fiber 119, which may be coupled to an optical transmission system. The output and input ports, for example, can all be implemented in the form of waveguides. In a specific embodiment, the grating waveguides 116 include a number of waveguides for coupling to the input and output ports. These waveguides have varying lengths for performing wavelength division multiplexing and demultiplexing functions. In some embodiments, each input port of the AWG has a center wavelength and pass band associated with light transmission. In a specific embodiment, the center wavelength corresponds to a particular wavelength associated with a frequency defined by ITU-T standards, for example, 193.1 THz.

FIG. 1B is a simplified cross-sectional view diagram of the hybrid integrated DWDM transmitter 100 according to an embodiment of the invention. This diagram is merely an example, which should not unduly limit the scope of the claims herein. One of ordinary skill in the art would recognize other variations, modifications, and alternatives. As shown, a waveguide includes doped silica region 121 enclosed in an undoped silica layer 122 on a silicon substrate 124. In a specific embodiment, the doped silica region 121 has a higher index of refraction than the undoped silica region. In a specific example, the doped silica region 121 has a index of refraction of about 1.47, and the undoped silica region has a index of refraction of about 1.45. In FIG. 1B, waveguide 121 is used to illustrate a cross sectional view of parts of waveguides in input port 113, grating waveguides 116, and output port 112.

According to embodiments of the present invention, integrated transmitter 100 includes one or more laser array chips, and each laser array chip may include two or more lasers. In the specific embodiment shown in FIG. 1A, the integrated transmitter 100 includes two direct-modulated laser (DML) array chips 114 and 115. In this specific example, each of DML array chips 114 and 115 includes four direct-modulated lasers (DMLs) made in InP. In a specific embodiment, the DMLs are of the types of distributed feedback (DFB) lasers and hence are operated in single frequency mode. In some embodiment, each DML works around a particular wavelength (frequency) defined by ITU-T standards, for example, 193.1 THz. Of course, one of ordinary skill in the art would recognize other variations, modifications, and alternatives.

According to some embodiments of the present invention, the DML arrays can also be single DML chips. In another embodiment, the DMLs can be substituted by integrated CW lasers and modulators, for example, an integrated DFB laser with an electro-absorption (EA) modulator. In an alternative embodiment, the lasers can also be distributed Bragg grating (DBR) lasers. In various embodiments, the AWG can be substituted by a broadband N×1 PLC waveguide combiner. In certain embodiments, an erbium doped fiber amplifier (EDFA) or an erbium doped waveguide amplifier (EDWA) can be used to compensate for the excess loss of the broadband combiner.

As shown in FIG. 1A, according to some embodiments of the present invention, the DML array chips are mounted on a portion of the silicon bench 101, in the vicinity of the input ports 113 of the AWG 110. In an embodiment, this mounting is performed using a p-side down, flip-chip method. Depending on the embodiment, other bonding methods using suitable adhesives can also be used. In FIG. 1B, the silicon bench 101 includes a silica-on-silicon substrate. A region of the silicon bench includes the AWG waveguide. In another region of the silicon bench, a portion of the silica is removed, and the DML array chips are mounted on the surface of the remaining silica over the silicon substrate. In another embodiment, the silica layer in a second region of the silicon bench is removed, and the DML array chips are mounted on the exposed silicon surface.

According to a specific embodiment of the invention, the silicon bench is mounted on a support component 130, as shown in FIG. 1B. In a specific embodiment, the support component 130 includes an optional submount 132 and a temperature adjustment component 134. The temperature adjustment component keeps the optical components such as the waveguides, the AWG and the DMLs at a suitable operating temperature, for example 25° C. In a specific embodiment, the temperature adjustment component includes a thermal electric cooler (TEC). In certain embodiments, integrated transmitter 100 also includes a micro heater in a proximity to each of the lasers for temperature adjustment. In an embodiment, at the operating temperature, the center wavelengths of the DMLs are matched approximately to those of the AWG input ports, for example, 193.1 THz, 193.2 THz, 193.3 THz, etc. Typically, the center wavelengths of the AWG can shift with temperature by ~0.01 nm/° C., and the center wavelengths of the InP lasers shift with temperature by ~0.1 nm/°

C. In some embodiments, the support component 130 also includes a submount 132 on the temperature adjustment component 134. In an embodiment, the submount 132 is made of materials containing metal or ceramics which provide mechanic strength. The submount also has good thermal conductance as required for the temperature adjustment component to control the temperature of the optical components, such as the laser and waveguide.

According to embodiments of the present invention, a main difficulty of hybrid integration is due to the spatial mode mismatch between the two types of waveguides. For applications in 1,550 nm wavelength window, mode diameters of standard silica PLC are typically about 8-10 µm, with output beam divergence of about 7-10°, similar to those of standard single mode fibers. Mode diameters of standard InP lasers, on the other hand, are typically about 2 µm, with output beam divergence of about 35°. Due to the mode mismatch, the optical coupling efficiency is low, with typical 10 dB coupling loss. The required placement accuracy is also high due to the large divergence angle of the laser output. These drawbacks can severely limit the usefulness of the hybrid method.

In specific embodiments of the present invention, mode converters (or beam expanders) in the InP chips are used to increase the laser output mode diameter comparable to that of the PLC waveguide. This reduces the coupling loss to 3 dB and to relax alignment requirements. According to embodiments of the invention, methods are provided for improved alignment and reduced coupling loss. Further details are discussed below.

Figure 2A:
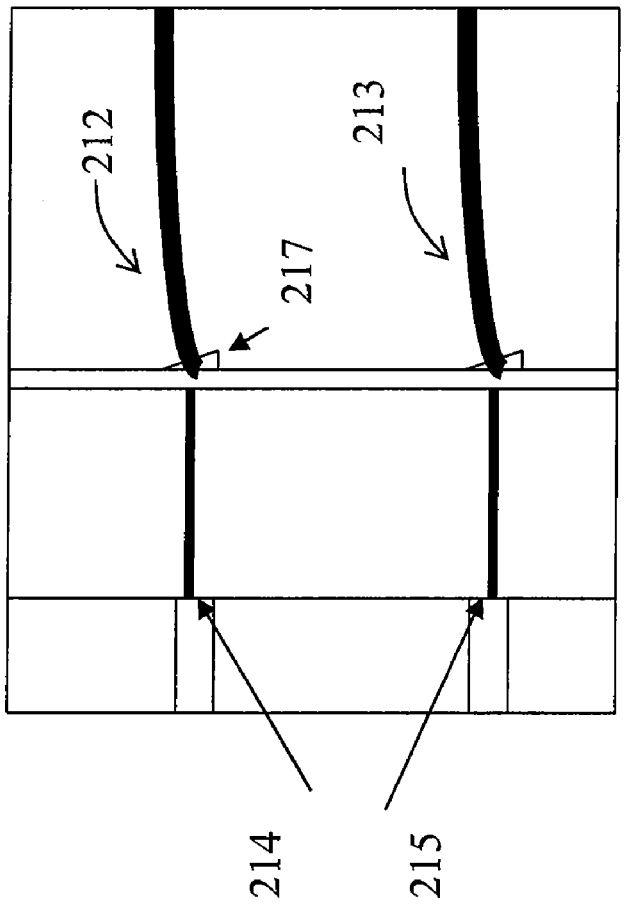
FIG. 2A is a simplified expanded top view diagram of a hybrid integrated DWDM transmitter according to another embodiment of the present invention.

FIG. 2A is a simplified expanded top view diagram of a hybrid integrated DWDM transmitter according to another embodiment of the present invention. These diagrams are merely examples, which should not unduly limit the scope of the claims herein. One of ordinary skill in the art would recognize other variations, modifications, and alternatives. As shown in FIG. 2A, hybrid integrated DWDM transmitter 200 includes waveguides 212 and 213 that are coupled to an optical multiplexer, such as an arrayed waveguide grating (AWG) (not shown). As an example, the waveguides and the AWG are made in silica-on-silicon planar lightwave circuit (PLC), as described in FIG. 1A. Integrated transmitter 200 also includes DFB lasers 214 and 215. Examples of DFB lasers were discussed above in connection with FIGS. 1A and 1B. In a specific embodiment of the present invention, the waveguides 212 and 213 are positioned at a slanted angle with respect to the lasers 214 and 215, respectively, to minimize the reflection form the AWG input waveguide facets, since DFB laser's performance tends to be degraded by light reflections. This slanted arrangement is shown as 217 in FIG. 2A. In a specific embodiment, the reflected light is at an angle of about 20° or greater off the laser axis.

Figure 2B:
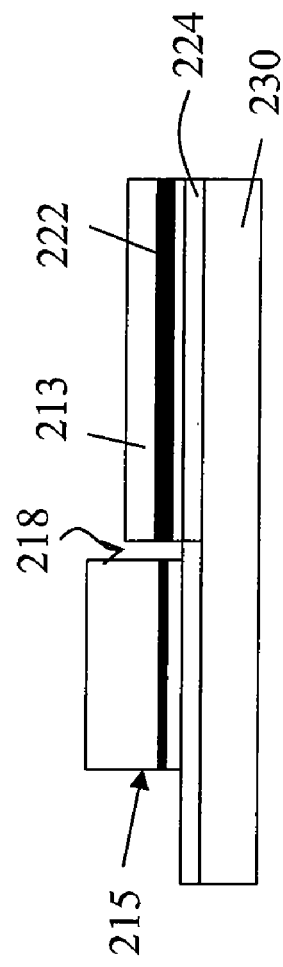
FIG. 2B is a simplified expanded cross-sectional view diagram of a hybrid integrated DWDM transmitter of FIG. 2A according to another embodiment of the invention.

FIG. 2B is a simplified expanded cross-sectional view diagram of the hybrid integrated DWDM transmitter 200 according to an embodiment of the invention. This diagram is merely an example, which should not unduly limit the scope of the claims herein. One of ordinary skill in the art would recognize other variations, modifications, and alternatives. As shown, the cross section view of transmitter 200 includes silica waveguide 213 enclosed in an undoped silica layer 222 on a silicon substrate 224. In an embodiment, the laser waveguide 215 is aligned to the silica waveguide 213 both vertically and horizontally with accuracies about ±2 µm. In some embodiments, there is no direct contact between facets (output ports) of laser 215 and the silica waveguide 213. In a specific example, the distance 218 between the facets is kept to within about 30 µm. Of course, there can be other variations, modifications, and alternatives.

In an embodiment, the physical separation between the individual lasers in the array, and hence the separation between the corresponding AWG input waveguides, is kept large enough to minimize thermal crosstalk and electrical crosstalk due to the high speed data modulations. Merely as an example, as shown in FIG. 2A, a suitable distance between lasers 214 and 215 is about 0.3-0.5 mm.

According to a specific embodiment of the present invention, the laser chips, the AWG, and the support component including the TEC, after proper electrical wire bonding, are put inside a single package to form a DWDM transmitter. Depending upon the embodiments, the transmitter can have various inputs and outputs. For example, the transmitter can have multiple electrical inputs that control and monitor the temperatures of the AWG and DMLs, the DC currents and RF modulations of the DMLs, etc. In another example, the transmitter has a single optical output, typically through an optical fiber pigtail, sending out the multiple-channel DWDM signals.

According to embodiments of the present invention, another important issue in the hybrid integration is thermal expansion mismatch between InP and silicon. Thermal expansion coefficient of InP is about $4.6 \times 10^{-6 \circ}$ C.$^{-1}$, and that of silicon is about $2.6 \times 10^{-6 \circ}$ C.$^{-1}$. In a specific embodiment of the invention, the bonding of the DMLs and the AWG is performed at about 300° C., while the operating temperature of the transmitter is about 30° C. Thus a 2 mm chip, which is about the size of a four DML array, will shrink by ~1.1 µm relative to the silicon substrate (AWG) after the bonding. Such mismatch would not only affect the waveguide alignment, but also introduces strains on the laser chip, which could degrade laser performance. For example, the strain may cause the center wavelengths of the lasers to shift away from the designed wavelengths.

In a specific embodiment of the present invention, the thermal mismatch problem can be minimized by using single DML chips. However, this will significantly increase the time to assemble the laser chips to the PLC bench. The problem can become more acute as the number of DWDM channels becomes large, for example, N=40. According to another embodiment of the invention, multiple small DML arrays, each with size <2 mm, are preferred for the DWDM transmitter. Each DML laser array may include two or more lasers. Of course, there can be other variations, modifications, and alternatives. For example, by using a low-temperature bounding method, DML arrays with size >2 mm can be included, according to some embodiments of the present invention.

According to an embodiment of the present invention, a method is provided for fine adjustment of the center wavelengths of the DMLs. Due to the manufacturing tolerance, the center wavelengths of the lasers may not fall exactly on the ITU-T grid at the temperature adjustment component operating temperature. The variation, for example, is typically on the order of 1 nm. In certain embodiments of the invention, a micro heater is used to raise a temperature of a DML waveguide. For example, in a specific embodiment, a micro heater is placed adjacent to each DML waveguide, either on the laser chip or on the PLC. According to a specific embodiment of the invention, by raising the local temperature to about 0-10° C. relative to the substrate, one can fine tune the center wavelengths of the DMLs to the ITU grids. Further details of the method are discussed below with reference to FIG. 3.

Figure 3:
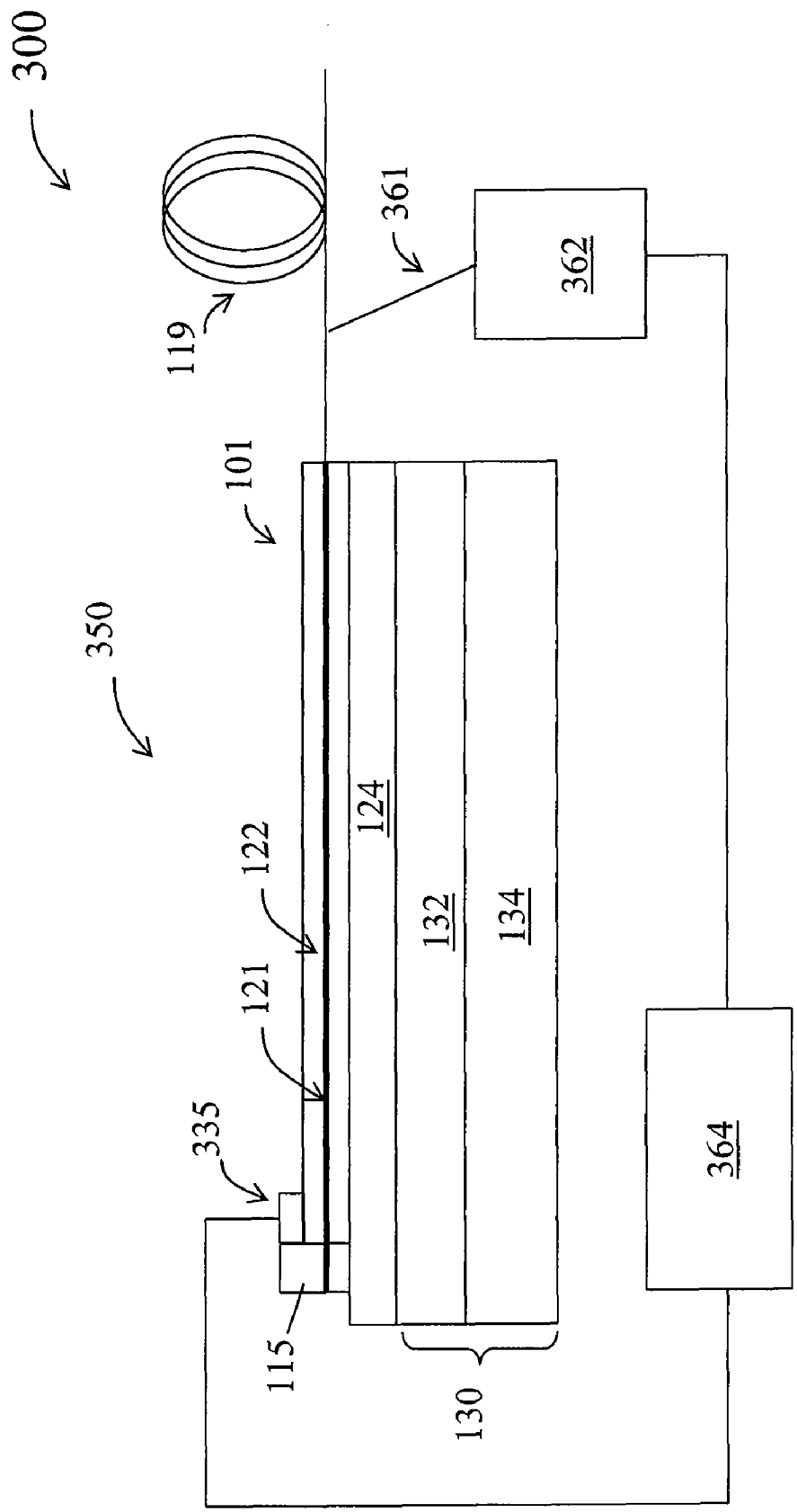
FIG. 3 a simplified view diagram of an integrated DWDM transmitter system according to another embodiment of the present invention.

FIG. 3 is a simplified view diagram of an integrated DWDM transmitter system according to another embodiment of the present invention. This diagram is merely an example, which should not unduly limit the scope of the claims herein.

One of ordinary skill in the art would recognize other variations, modifications, and alternatives. As shown, integrated transmitter system 300 includes a hybrid integrated transmitter 350 similar to transmitter 100 discussed above in connection with FIGS. 1A and 1B. For easy reference, corresponding parts of the devices are marked by identical numerals. As shown, hybrid integrated transmitter 350 includes a laser 115, a silica waveguide 121 formed in a silicon bench 101 which includes undoped silica layer 122 overlying a silicon layer 124. The silicon substrate 124 overlies a support component 130, which includes temperature adjustment component 134, such as a thermal electric cooler (TEC), and an optional submount 132. In a specific embodiment, integrated transmitter system 300 also includes a micro heater 335 in a proximity to the laser 115, an optical analyzer 362, and a controller 364. The optical analyzer 362 is optically coupled to an output waveguide in the integrated DWDM transmitter, which may be optically coupled to an optical communication system through optical fiber 119. The controller 364 is electrically coupled to the optical analyzer 362 and the micro heater 335. In an embodiment, a micro heater is placed adjacent to each laser, either on the laser chip or on the PLC. In a specific embodiment, the micro heater is a resistive element, such as a metal strip, deposited in a proximity to laser 115 as shown in FIG. 3.

Although the above has been shown using a selected group of components for the integrated DWDM transmitter system, there can be many alternatives, modifications, and variations. For example, some of the components may be expanded and/or combined. Other components may be inserted to those noted above. Depending upon the embodiment, the arrangement of components may be interchanged with others replaced. For example, integrated transmitter 350 may include features in transmitter 200 discussed above in connection with FIGS. 2A and 2B.

Figure 4A:
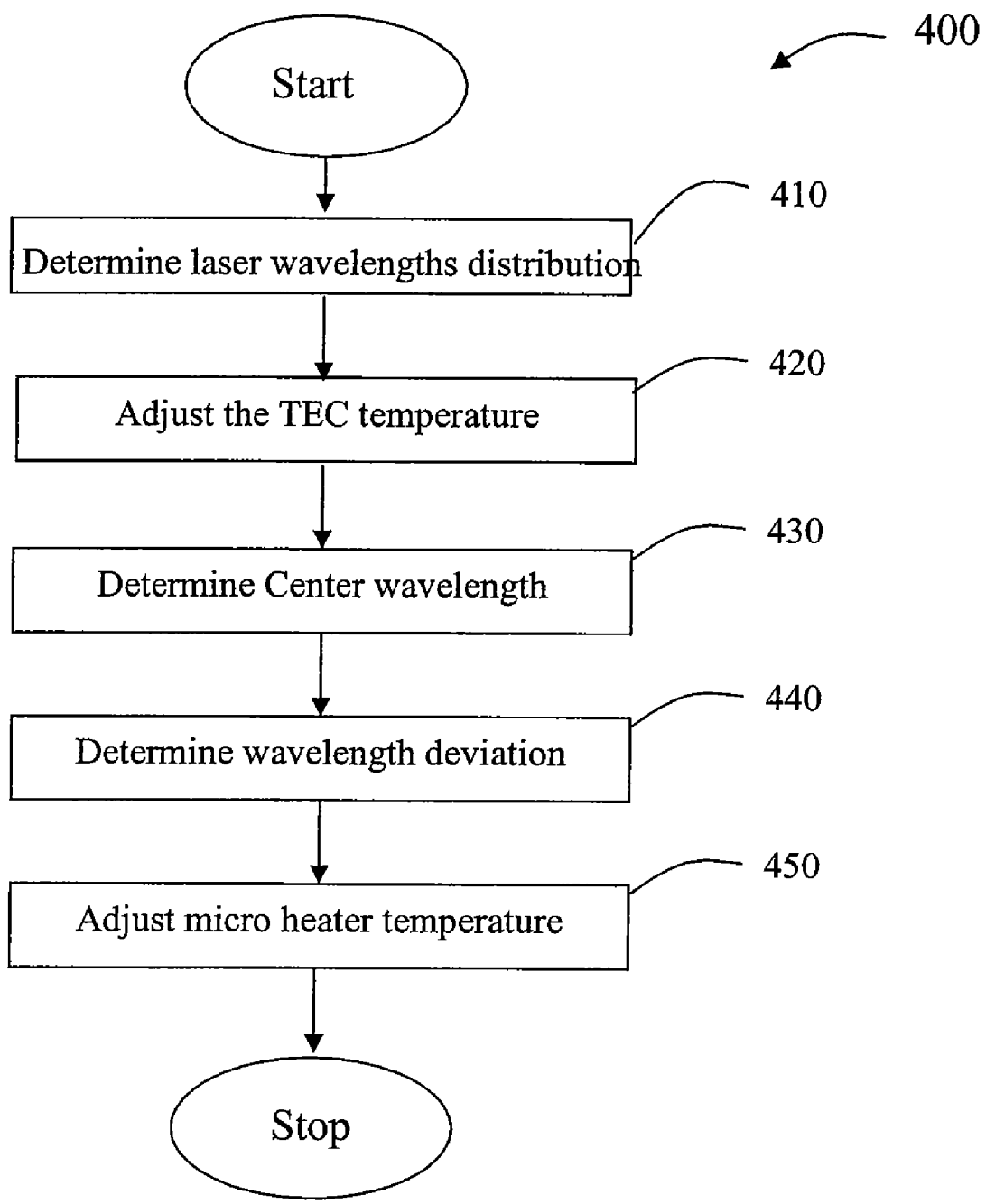
FIG. 4A is a simplified flowchart of a method for maintaining a target wavelength in an integrated DWDM transmitter according to an embodiment of the invention.
Figure 4B:
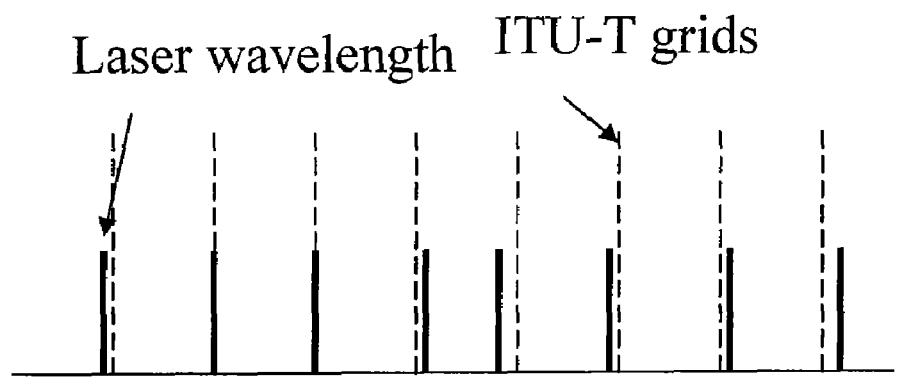
FIGS. 4B-4D are simplified wavelength diagrams illustrating the method for maintaining a target wavelength in an integrated DWDM transmitter according to the above embodiment of the invention.
Figure 4C:
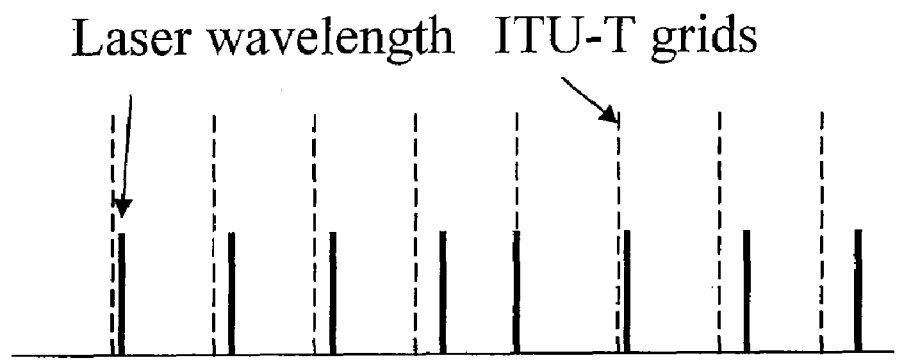
Figure 4D:
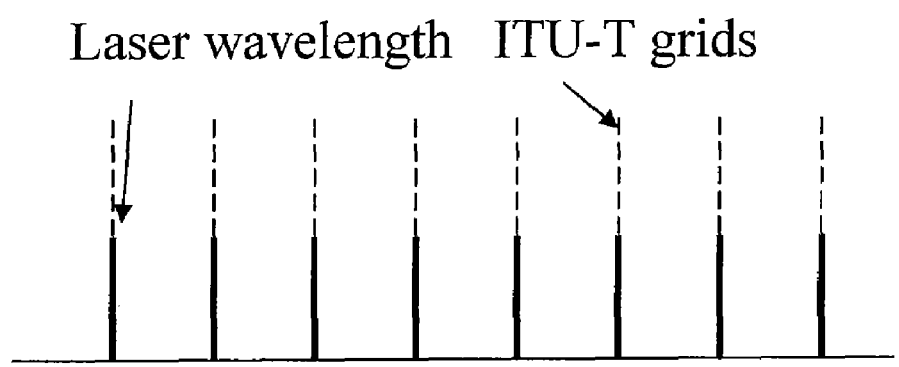

FIG. 4A is a simplified flowchart of a method for maintaining a target wavelength in an integrated DWDM transmitter according to an embodiment of the invention. FIGS. 4B-4D are simplified wavelength diagrams according to the method. These diagrams are merely examples, which should not unduly limit the scope of the claims herein. One of ordinary skill in the art would recognize other variations, modifications, and alternatives. The method can be briefly outlined below, with reference to the integrated DWDM system in FIG. 3, the flowchart in FIG. 4A, and the wavelength diagrams in FIG. 4B-4D.

1. (Process 410) Determine laser wavelengths distribution at a predetermined global TEC temperature. An example of wavelength distribution at TEC temperature of 25° C. is shown in FIG. 4B.
2. (Process 420) Adjust the TEC to a second global temperature to shift the all laser wavelengths to below the target wavelengths for the corresponding ITU-T grids. An example is shown in FIG. 4C.
3. (Process 430) For each laser, determine a center frequency at an output waveguide, using the optical analyzer 362;
4. (Process 440) Determine a deviation between the measured center wavelength and the target wavelength, using the controller 364;
5. (Process 450) Adjust a temperature of the micro heater 335, using the controller 364, to increase the center wavelength of the laser to approach the corresponding target wavelength according to the ITU-T grids. FIG. 4D is an example of wavelengths shifted to the corresponding target wavelengths according to the ITU-T grids.

The above sequence of processes provides a method for maintaining a target wavelength associated with an integrated DWDM transmitter according to an embodiment of the invention. As shown, the method uses a combination of processes including a way of using the TEC to shift all laser wavelengths to the shorter wavelength side of the grids and using local micro heaters to increase the local temperature at each laser as needed to shift all laser wavelengths to the ITU-T grids. Other alternatives can also be provided in which steps are added, one or more steps are removed, or one or more steps are provided in a different sequence without departing from the scope of the claims herein. Further details of the present method can be found throughout the present specification.

Figure 5:
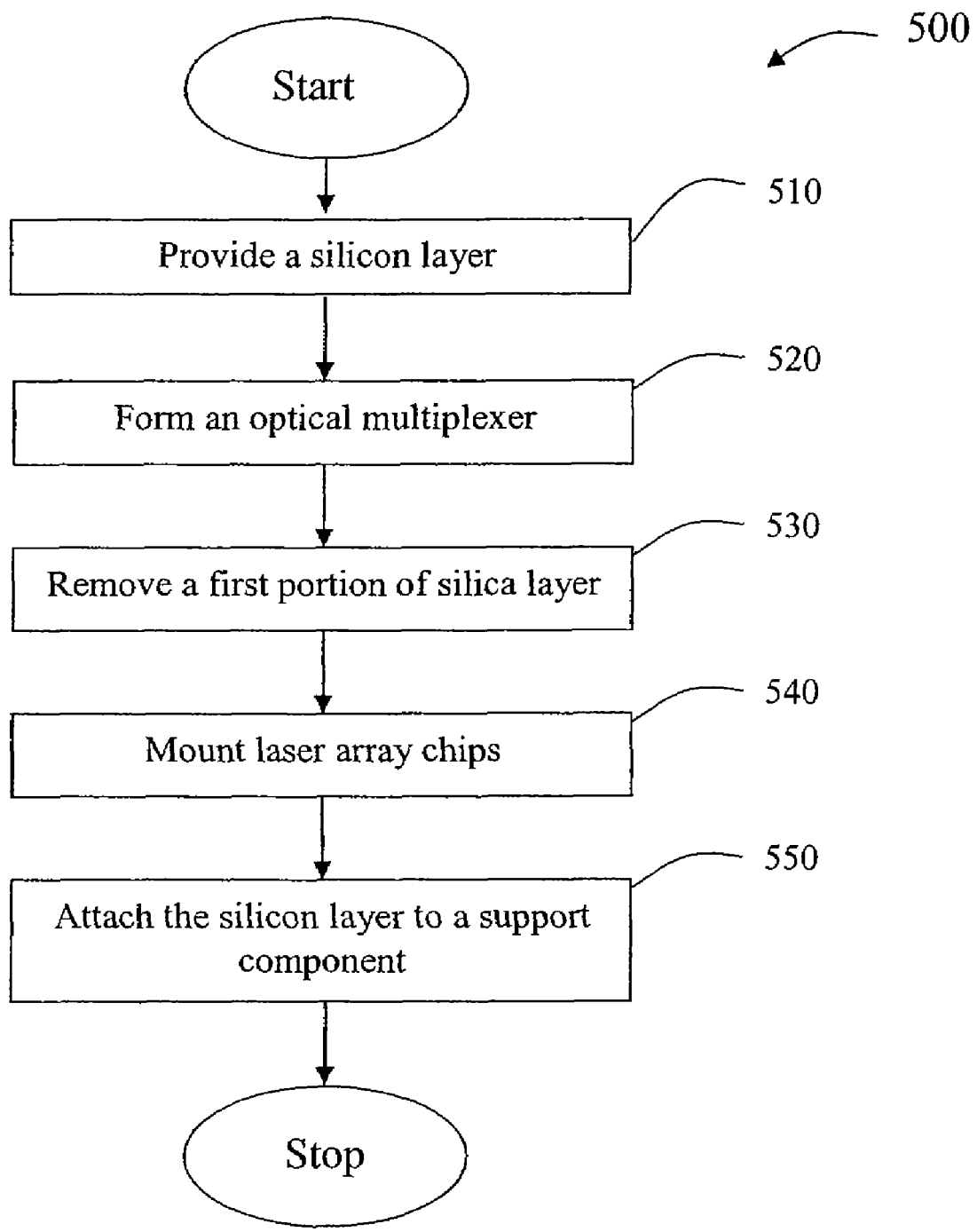
FIG. 5 is a simplified flowchart of a method for making in an integrated DWDM transmitter according to an embodiment of the present invention

FIG. 5 is a simplified flowchart of a method for making an integrated DWDM transmitter according to an embodiment of the invention. This diagram is merely an example, which should not unduly limit the scope of the claims herein. One of ordinary skill in the art would recognize other variations, modifications, and alternatives. The method can be briefly outlined below, with reference to the flowchart in FIG. 5.

1. (Process 510) Provide a silicon layer;
2. (Process 520) Form an optical multiplexer in a silica layer over the silicon layer;
3. (Process 530) Remove at least a first portion of the silica layer to expose a surface;
4. (Process 540) Mount one or more semiconductor laser array chips to the surface; and
5. (Process 550) Attach the silicon layer to a support component.

As shown, FIG. 5 provides a method for making an integrated DWDM transmitter apparatus. The method includes (Process 510) providing a silicon layer and (Process 520) forming an optical multiplexer within a silica layer located on the silicon layer. In an embodiment, the optical multiplexer includes a plurality of input waveguides and at least an output waveguide. In a specific embodiment, the optical multiplexer includes an array waveguide grating. In Process 530, the method includes removing at least a first portion of the silica layer to expose a surface. Depending on the embodiment, the exposed surface can be a silicon surface or a silica surface. In Process 540 the method also includes mounting one or more semiconductor laser array chips to the surface. In a specific embodiment, each of the laser array chips includes two or more InP laser diodes. The mounting can be performed, for example, using a flip-chip mounting method. Each of the one or more laser array chips includes two or more lasers and each of the two or more lasers is optically coupled to a corresponding one of the plurality of input waveguides. The method includes (Process 550) attaching the silicon layer to a support component, the support component including a temperature adjustment component. In a specific embodiment, the process of forming the optical multiplexer (Process 520) includes the following processes: forming a first un-doped silica sub-layer on the silicon layer; forming a doped silica sub-layer on the first un-doped silica sub-layer; etching at least a second portion of the doped silica sub-layer; and depositing a second un-doped silica sub-layer on the etched doped silica sub-layer and the first un-doped silica sub-layer.

The above sequence of processes provides a method for making an integrated DWDM transmitter apparatus according to an embodiment of the invention. As shown, the method uses a combination of processes including a way of making an optical multiplexer in a silica-on-silicon substrate and mounting laser array chips on a portion of the substrate. Other alternatives can also be provided in which steps are added, one or more steps are removed, or one or more steps are provided in a different sequence without departing from the scope of the claims herein. Further details of the present method can be found throughout the present specification.

Many benefits are achieved by way of the present invention over conventional techniques. For example, in certain embodiments, the invention provides methods and apparatus that use a silica/silicon AWG as a substrate to mount semiconductor (InP) laser/modulator chips. Because the processing cost per unit area for silica-on-silicon can be two orders of magnitude lower than that for InP, the AWG according to embodiments of the present invention can be made at much lower cost. Silica-on-silicon AWGs is a much more mature technology. For example, transmission loss is much smaller in AWGs made of silica-on-silicon than those made of InP. Moreover according to an embodiment of the invention, without the AWG, the InP chip can be made much smaller. The high yield and the small size significantly reduce the cost of the InP chips used for hybrid integration in accordance to embodiments of the present invention. In term of finished device, the size of a hybrid integrated DWDM transmitter according to specific embodiments of the invention is comparable to that of a monolithically integrated DWDM transmitter. Thus the small size advantage of an integrated DWDM transmitter is retained according to embodiments of the present invention.

While the preferred embodiments of the invention have been illustrated and described, it will be clear that the invention is not limited to these embodiments only. Numerous modifications, changes, variations, substitutions and equivalents will be apparent to those skilled in the art without departing from the spirit and scope of the invention as described in the claims.

What is claimed is:

1. An integrated DWDM transmitter apparatus, the apparatus comprising:
    a support component, the support component including a temperature adjustment component;
    a silica-on-silicon substrate overlying the support component, the silica-on-silicon substrate including a silica layer and a silicon layer, the silica-on-silicon substrate corresponding to a substrate surface, the substrate surface including a first surface region and a second surface region, the first surface region and the second surface region not being coplanar;
    an optical multiplexer within the silica layer, the optical multiplexer including a plurality of input waveguides and at least an output waveguide; and
    one or more semiconductor InP laser array chips mounted on the first surface region of the silica-on-silicon substrate, each of the one or more laser array chips including two or more lasers, each of the two or more lasers being optically coupled to a corresponding one of the plurality of input waveguides;
    wherein the optical multiplexer overlies the silicon layer and is located under the second surface region.

2. The apparatus of claim 1 wherein the optical multiplexer includes an array waveguide grating.

3. The apparatus of claim 1 wherein each of the one or more semiconductor laser array chips is mounted on the first surface region of the silica-on-silicon substrate using a flip-chip method.

4. The apparatus of claim 1 further comprising a plurality of micro heaters, each of the micro heaters being disposed adjacent to one of the lasers.

5. The apparatus of claim 1 wherein the two or more laser associated with each of the one or more laser array chips are separated by a distance of about 0.3-0.5 mm.

6. The apparatus of claim 1 wherein the optical multiplexer includes a doped silica waveguide in an intrinsic silica layer.

7. The apparatus of claim 1 wherein a coupling between each of the two or more lasers and the corresponding one of the plurality of input waveguides is characterized by a slanted angle of about 20° or greater.

8. The apparatus of claim 1 wherein a coupling between each of the two or more lasers and the corresponding one of the plurality of input waveguides includes a gap characterized by a distance of about 30 um or smaller.

9. The apparatus of claim 1 wherein the support component further comprises a submount, the submount including a metal-containing or ceramic-containing material.

10. The apparatus of claim 1 wherein each of the one or more semiconductor laser array chips is characterized by a width of 2 mm or smaller in the direction perpendicular to a laser axis.

11. The apparatus of claim 1 wherein each of the one or more semiconductor laser array chips is characterized by a width of 2 mm or greater, each of the laser array chips being mounted using a low-temperature bounding method.

12. The apparatus of claim 1 wherein the temperature adjustment component includes a thermal electric cooler (TEC), the TEC being capable of varying a temperature in a 10° C. range.

13. The apparatus of claim 1 further comprising:
    an optical analyzer optically coupled to the output waveguide for measuring a center frequency at the output waveguide; and
    a controller electrically coupled to the optical analyzer and the temperature adjustment component for adjusting a temperature of the temperature adjustment component using information associated with of the center wavelength.

14. The apparatus of claim 1 wherein each of the one or more semiconductor laser array chips includes direct-modulated lasers.

15. The apparatus of claim 1 wherein each of the one or more semiconductor laser array chips includes distributed feedback (DFB) lasers.

16. The apparatus of claim 1 wherein each of the one or more semiconductor laser array chips includes an integrated DFB laser with an electro-absorption (EA) modulator.

17. The apparatus of claim 1 wherein each of the one or more semiconductor laser array chips includes a distributed Bragg grating (DBR) lasers.

18. The apparatus of claim 1 wherein the optical multiplexer includes a broadband N×1 PLC waveguide combiner.

19. The apparatus of claim 18 further comprising an erbium doped fiber amplifier (EDFA) or an erbium doped waveguide amplifier (EDWA) for compensating for the excess loss of the broadband combiner.

20. A DWDM transmitter system, comprising:
    a support component, the support component including a temperature adjustment component;
    a silica-on-silicon substrate overlying the support component, the silica-on-silicon substrate including a silica layer and a silicon layer, the silica-on-silicon substrate corresponding to a substrate surface, the substrate surface including a first surface region and a second surface region, the first surface region and the second surface region not being coplanar;
    an optical multiplexer within the silica layer under the first surface region of the silica-on-silicon substrate, the optical multiplexer including a plurality of input waveguides and at least an output waveguide;

one or more semiconductor InP laser array chips mounted on the second surface region of the silica-on-silicon substrate, each of the one or more laser array chips including two or more lasers, each of the two or more lasers being optically coupled to a corresponding one of the plurality of input waveguides;

a plurality of micro heaters, each of the plurality of micro heaters being disposed adjacent to one of the lasers;

an optical analyzer optically coupled to the output waveguide for measuring a center wavelength at the output waveguide; and a controller electrically coupled to the optical analyzer and the plurality of micro heaters for adjusting a temperature of the temperature adjustment component using information associated with the center wavelength.

21. The apparatus of claim 20 wherein the optical multiplexer includes an array waveguide grating.

22. The apparatus of claim 20 wherein each of the one or more semiconductor laser array chips is mounted on the second surface region of the silica-on-silicon substrate using a flip-chip method.

* * * * *